United States Patent
Dal

(10) Patent No.: US 9,117,667 B2
(45) Date of Patent: Aug. 25, 2015

(54) CARBON LAYER AND METHOD OF MANUFACTURE

(75) Inventor: Markvan Dal, Heverlee (BE)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/546,188

(22) Filed: Jul. 11, 2012

(65) Prior Publication Data

US 2014/0017883 A1   Jan. 16, 2014

(51) Int. Cl.
*H01L 21/44* (2006.01)
*H01L 21/02* (2006.01)
*H01L 29/16* (2006.01)
*H01L 29/423* (2006.01)
*H01L 29/786* (2006.01)

(52) U.S. Cl.
CPC .... *H01L 21/02378* (2013.01); *H01L 21/02381* (2013.01); *H01L 21/02433* (2013.01); *H01L 21/02491* (2013.01); *H01L 21/02527* (2013.01); *H01L 29/1606* (2013.01); *H01L 29/42384* (2013.01); *H01L 29/78603* (2013.01); *H01L 29/78684* (2013.01)

(58) Field of Classification Search
USPC ............ 257/E21.09, E21.296; 438/664
See application file for complete search history.

(56) References Cited

U.S. PATENT DOCUMENTS

| | | | |
|---|---|---|---|
| 7,129,548 B2* | 10/2006 | Chan et al. | 257/382 |
| 7,528,067 B2* | 5/2009 | Chan et al. | 438/651 |
| 7,737,032 B2* | 6/2010 | Chan et al. | 438/664 |
| 7,888,264 B2* | 2/2011 | Chan et al. | 438/664 |
| 8,637,118 B2* | 1/2014 | Zenasni | 427/249.1 |
| 2006/0033165 A1* | 2/2006 | Chan et al. | 257/368 |
| 2006/0270225 A1* | 11/2006 | Kawai et al. | 438/682 |
| 2006/0273323 A1* | 12/2006 | Yamamoto et al. | 257/77 |
| 2007/0087536 A1* | 4/2007 | Chan et al. | 438/585 |
| 2008/0268600 A1* | 10/2008 | Chan et al. | 438/299 |
| 2010/0247801 A1* | 9/2010 | Zenasni | 427/554 |
| 2010/0304563 A1* | 12/2010 | Chan et al. | 438/655 |
| 2010/0317132 A1* | 12/2010 | Rogers et al. | 438/27 |
| 2011/0309334 A1 | 12/2011 | Chang et al. | |
| 2012/0139047 A1* | 6/2012 | Luo et al. | 257/347 |
| 2012/0161098 A1* | 6/2012 | Hiura et al. | 257/9 |
| 2012/0181586 A1* | 7/2012 | Luo et al. | 257/288 |

(Continued)

FOREIGN PATENT DOCUMENTS

| | | |
|---|---|---|
| DE | 112011100901 | 1/2013 |
| EP | 2589679 A1 | 5/2013 |
| KR | 101156355 | 6/2011 |

OTHER PUBLICATIONS

Kang et al. "Few-Layer graphene growth on 6H-SiC(0001) surface at low temperature via Ni-silicidation reactions", Applied Physics letters, 100, all pages.*

(Continued)

*Primary Examiner* — Telly Green
(74) *Attorney, Agent, or Firm* — Slater & Matsil, L.L.P.

(57) ABSTRACT

A system and method for manufacturing a carbon layer is provided. An embodiment comprises depositing a first metal layer on a substrate, the substrate comprising carbon. A silicide is epitaxially grown on the substrate, the epitaxially growing the silicide also forming a layer of carbon over the silicide. In an embodiment the carbon layer is graphene, and may be transferred to a semiconductor substrate for further processing to form a channel within the graphene.

20 Claims, 3 Drawing Sheets

(56) References Cited

U.S. PATENT DOCUMENTS

2013/0127023 A1     5/2013     Zenasni
2014/0051241 A1*    2/2014     Kinoshita et al. ............. 438/602

OTHER PUBLICATIONS

Chen "Metal Silicides: An Integral Part of Microelectronics", JOM, Sep. 2005, pp. 24-30.*

Liu et al. "Initial Stage of Cu/3C-Sic(111) interface formation at room temperature" Abstract, ACS, 2009.*

Tung, et al., "Formation of Ultrathin Single-Crystal Silicide Films on Si: Surface and Interfacial Stabilization of Si—NiSi2 Epitaxial Structures," Physical Review Letters, vol. 50, No. 6, Feb. 7, 1983, pp. 429-444.

Novoselov, et al., "Electric Field Effect in Atomically Thin Carbon Films," Science Magazine, vol. 306, Oct. 22, 2004, pp. 666-669.

Berger, et al., "Electronic Confinement and Coherence in Patterned Epitaxial Graphene," Science Magazine, vol. 312, May 26, 2006, pp. 1191-1196.

Eda, et al., "Large-Area Ultrathin Films of Reduced Graphene Oxide as a Transparent and Flexible Electronic Material," Nature Nanotechnology, vol. 3, May 2008, published online Apr. 6, 2008, pp. 270-274.

Kim, et al., "Large-Scale Pattern Growth of Graphene Films for Stretchable Transparent Electrodes," Nature, vol. 457, Feb. 5, 2009, Macmillan Publishers Limited, pp. 706-710.

Li, et al., "Transfer of Large-Area Graphene Films for High-Performance Transparent Conductive Electrodes," Nano Letters, American Chemical Society, vol. 9, No. 12, Oct. 10, 2009, pp. 4359-4363.

Meric, et al., "High-Frequency Performance of Graphene Field Effect Transistors with Saturating IV-Characteristics," Electron Devices Meeting (IEDM), 2011 IEEE International, Conference Dates Dec. 5-7, 2011, 4 pages.

Wu, et al., "Record High RF Performance for Epitaxial Graphene Transistors," Electron Devices Meeting (IEDM), 2011 IEEE International, Conference Dates Dec. 5-7, 2011, 23 pages.

van der Veen, et al., "Synthesis and Characterization of Graphene by Solid State Reactions," IMEC CORE CMOS, Program Technical Week, FEOL Program Cluster Workshop, Oct. 2011, 23 pages.

Hähnel, et al., "Oriented growth of silicide and carbon in SiC based sandwich structures with nickel," Materials Chemistry and Physics, vol. 110 (2008), 15 pages, Feb. 2008.

Geim, A.K. et al., "The Rise of Graphene," Nature Materials, vol. 6, Issue 3, 2007, 14 pages, 2007.

Rijnders, M.R. et al., "Pattern formation in Pt—SiC diffusion couples," Solid State Ionics, vol. 95, Issues 1-2, Elsevier B.V., Feb. 2, 1997, pp. 51-59.

* cited by examiner

CARBON LAYER AND METHOD OF MANUFACTURE

BACKGROUND

Generally, integrated circuits may be formed from a variety of active and passive devices on a semiconductor substrate. These active and passive devices may include, for example, transistors, resistors, capacitors, inductors, or the like. Additionally, the integrated circuits may also have a plurality of interleaved conductive layers and insulative layers in order to interconnect the various active and passive devices into the desired functional circuitry. This functional circuitry may be connected to external devices using, for example, contact pads or other types of connection to provide power, ground and signal connections to the various active and passive devices.

However, in the race to further miniaturize the integrated circuits, and in particular to further miniaturize the active and passive devices within the integrated circuits, problems have arisen with the various materials that have historically been used to form the active and passive devices. As such, new materials have been investigated as potential replacement materials for various aspects of the active and passive devices in an effort to make the active and passive devices not only smaller and more efficient.

Unfortunately, while there may be materials that may offer benefits if used in various aspects of the active and passive devices, a problem may arise in that the materials may not be easy to incorporate within the manufacturing processes that may be utilized to mass produce the integrated circuit for consumption by the general public. As such, without the ability to mass produce the materials and to integrate them into a mass production process flow, such materials may be only minimally useful. As such, it would be beneficial to find a useful material that is also easily scalable so that the material can be mass produced and incorporated into the mass production of integrated circuit process flows.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a graphene layer formed from a carbon containing substrate. Other embodiments may also be applied, however, to other methods of forming graphene.

Figure 1:
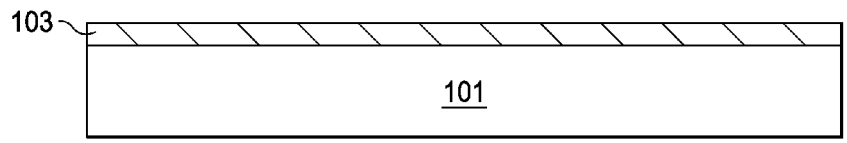
FIG. 1 illustrates a first metal layer over a substrate in accordance with an embodiment.

With reference now to FIG. 1, there is shown a first substrate 101 and a first metal layer 103. The first substrate 101 may be a carbon containing semiconductor material such as silicon carbon (SiC), silicon germanium carbon (SiGeC), combinations of these or the like, although any suitable material that forms a silicide, germanide (a metal-germanium compound), germanosilicide (a metal-silicon-germanium compound), or the like and contains carbon may alternatively be utilized. The first substrate 101 may have a thickness of between about 0.5 μm and about 500 μm, such as about 200 μm.

The first substrate 101 may additionally have a crystalline structure that is conducive to growing a silicide epitaxially on the first substrate 101 (not illustrated in FIG. 1 but illustrated and discussed below with respect to FIG. 2). In an embodiment the first substrate 101 may have a (111) crystalline orientation, although the embodiments are not intended to be limited to a (111) crystalline orientation. Any suitable orientation that allows for epitaxial growth of a silicide on the first substrate 101 may alternatively be utilized, and all such orientations are fully intended to be included within the scope of the embodiments.

However, as one of ordinary skill in the art will recognize, the first substrate 101 is not intended to be limited to a single layer of SiC. Any other suitable layer or combination of layers that forms a silicide, germanicide, or germanosilicide and contains carbon may alternatively be utilized. For example, in an alternative embodiment the first substrate 101 may comprise a layer of SiC on top of a layer of an insulator such as an oxide. In such an embodiment the insulator may have a thickness of between about 20 nm to about 500 nm, and the layer of SiC may have a thickness of between about 10 nm and about 1000 nm. This and any other suitable layer or combination of layers may alternatively be utilized, and all such layer or combination of layers are fully intended to be included within the scope of the embodiments.

The first metal layer 103 may be formed over the first substrate 101. The first metal layer 103 may be a material that can be utilized to form a silicide with the first substrate 101 but that does not form appreciable amounts of a natural carbide. In an embodiment in which the first substrate 101 is silicon carbon, the first metal layer 103 may be, for example, nickel, platinum, cobalt, palladium, copper, iron, combinations of these, or the like. Any suitable material that forms a silicide but does not form an appreciable amount of a natural carbide may alternatively be utilized.

Additionally, in order to promote the formation of graphene as opposed to other forms of carbon (such as graphite), the first metal layer 103 may be formed as a thin layer. In an embodiment the first metal layer 103 may be formed using a deposition process such as chemical vapor deposition (CVD), physical vapor deposition (PVD), combinations of these, or the like, to have a thickness of between about 0.5 nm and about 10 nm, such as about 2 nm. However, any other suitable thickness and process may alternatively be utilized to form the first metal layer 103.

Figure 2:
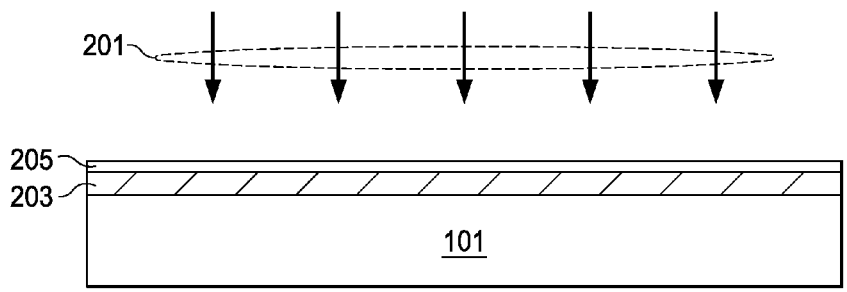
FIG. 2 illustrates a formation of carbon layer and a silicide layer in accordance with an embodiment.

FIG. 2 illustrates a first anneal (represented in FIG. 2 by the arrows labeled 201) that, in an embodiment in which the first substrate 101 is silicon carbon, may be performed on the first substrate 101 and the first metal layer 103 to form a silicide layer 203 and a carbon layer 205. However, in alternative embodiments in which the first substrate 101 is silicon germanium carbon, the first anneal 201 may be used to form a germanosilicide in place of the silicide layer 203, and, in embodiments in which the first substrate 101 is germanium carbon, the first anneal 201 may be used to form a germanide layer in place of the silicide layer 203. All such embodiments are fully intended to be included within the scope of the embodiments.

In an embodiment the first anneal 201 may be, e.g., a thermal anneal in which the first substrate 101 and the first metal layer 103 are placed inside a non-reactive ambient atmosphere and heated to a temperature of between about room temperature and about 800° C., such as about 200° C. for a time period of between about 1 s and about 5 min, such as about 30 s. However, other suitable annealing processes, such as rapid thermal anneals, plasma anneals, laser anneals, room temperature anneals, combinations of these, or the like, may alternatively be utilized.

In an embodiment in which the first substrate 101 is silicon carbon, the silicon within the first substrate 101 reacts with the material in the first metal layer 103 to form the silicide layer 203. By using a low temperature range for the first anneal 201, along with the crystalline orientation of the first substrate 101, and the lattice constant of the chosen silicide being close to the lattice constant of the first substrate 101, the silicide layer 203 may be grown epitaxially on the first substrate 101. By using this process, a high-quality layer of graphene may be manufactured.

Additionally, by using these materials, the chemical reaction to form the silicide may follow the reaction formula in Equation 1, with Me being the material of the first metal layer 103.

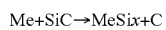

$$Me + SiC \rightarrow MeSix + C \qquad \text{Eq. 1}$$

As can be seen, by reacting the SiC with the material from the first metal layer 103 (which has no natural carbides) carbon will be a by-product of the reaction. As the material of the first metal layer 103 reacts with and diffuses into the first substrate 101, this carbon will be left as a by-product on a top surface of the silicide layer 203 to form the carbon layer 205.

Additionally by keeping the first metal layer 103 as a thin layer, the carbon layer 205 will be graphene instead of other potential by-products, such as graphite. The thickness of the carbon layer 205 may also be tuned by adjusting the thickness of the first metal layer 103. For example, in an embodiment in which the first metal layer 103 has a thickness of between about 0.5 nm and about 10 nm, such as about 2 nm, the carbon layer 205 may have a thickness of between about 1 monolayer and about 10 monolayers, such as about 2 monolayers. In an embodiment in which monolayers may have a thickness of about 0.5 nm, the carbon layer 205 may have a thickness of between about 0.5 nm and about 5 nm, such as about 1 nm.

Figure 3:
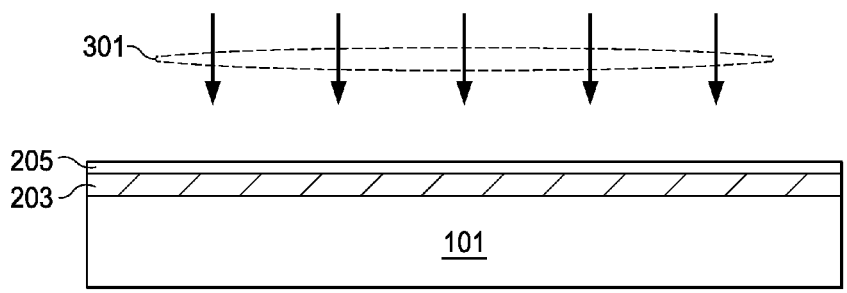
FIG. 3 illustrates a cure that may be performed on the carbon layer in accordance with an embodiment.

FIG. 3 illustrates an optional second anneal (represented by lines labeled 301 in FIG. 3) that may be performed after the carbon layer 205 has been formed. In an embodiment the second anneal 301 may be performed in order to cure the carbon layer 205 and to help to fix any non-uniformities that may have formed in the crystalline lattice of the carbon layer 205 during formation. The second anneal 301 may be performed by placing the first substrate 101 with the carbon layer 205 into an non-reactive ambient and heating the first substrate 101 and the carbon layer 205 to a temperature of between about 500° C. and about 1,100° C., such as about 850° C. The second anneal 301 may be performed as a spike anneal, although any other suitable type of anneal may alternatively be utilized, and may be performed for a time period of between about 0.1 s and about 5 min, such as about less than 1 minute. In an embodiment in which the second anneal 301 is a spike anneal, the second anneal 301 may be performed for a time period of less than 1 second.

By forming the carbon layer 205 with a silicide process as described, a very high-quality carbon layer 205 may be obtained. Additionally, such a process may easily be integrated into existing manufacturing processes. As such, a high-quality, efficient method of manufacturing the carbon layer 205 may be obtained.

Figure 4:
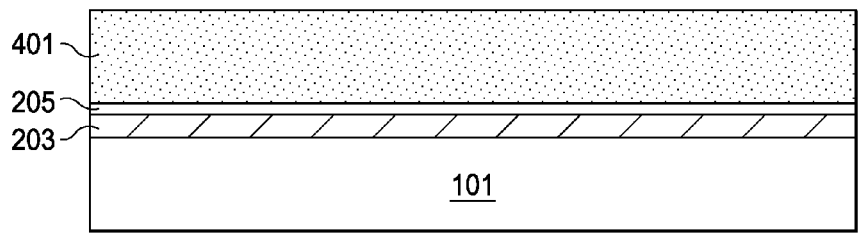
FIG. 4 illustrates a placement of a transfer layer on the carbon layer in accordance with an embodiment.

FIG. 4 illustrates that, once the carbon layer 205 has been formed and/or optionally cured, a transfer layer 401 may be formed on the carbon layer 205 in order to begin the process of transferring the carbon layer 205 to a second substrate 601 (not illustrated in FIG. 4 but illustrated and discussed further below with respect to FIG. 6). In an embodiment the transfer layer 401 may be a material that may be used to hold and protect the carbon layer 205 during the removal of the silicide layer 203 from the carbon layer 205, while also allowing for an easy removal of the transfer layer 401 once the carbon layer 203 has been transferred. For example, the transfer layer 401 may be polymethyl-methacrylate (PMMA), although any other suitable material, such as methyacrylic resin or Novolac resin, or the like, may alternatively be utilized.

In an embodiment in which the transfer layer 401 is PMMA, the transfer layer 401 may be placed on the carbon layer 205 using, e.g., a spin-coating process, although any other suitable deposition process may also be utilized. Once in place, the PMMA may be cured and solidified. This solidified PMMA both protects the carbon layer 205 and also allows for the movement and control of the carbon layer 205 through the transfer layer 401.

Figure 5:
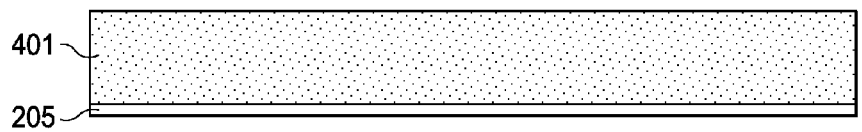
FIG. 5 illustrates a removal of the carbon layer from the substrate and the silicide layer in accordance with an embodiment.

FIG. 5 illustrates that, once the transfer layer 401 is in place over the carbon layer 205, the first substrate 101 and the silicide layer 203 may be removed in order to expose a back side of the carbon layer 205. In an embodiment the first substrate 101 and the silicide layer 203 may be removed using one or more etching processes such as a wet etch that is selective to the first substrate 101 and the silicide layer 203. As such, while the precise etchants used may depend at least in part upon the materials of the first substrate 101 and the silicide layer 203, in an embodiment in which the first substrate 101 is silicon carbon and the silicide layer 203 is nickel silicide, the first substrate 101 may be removed with an etchant such as KOH while the silicide layer 203 may be separately removed with an etchant such as HF, $HNO_3/HCl$. However, any suitable combination of etchants and process steps may alternatively be utilized to remove the first substrate 101 and the silicide layer 203 from the back side of the carbon layer 205.

Figure 6:
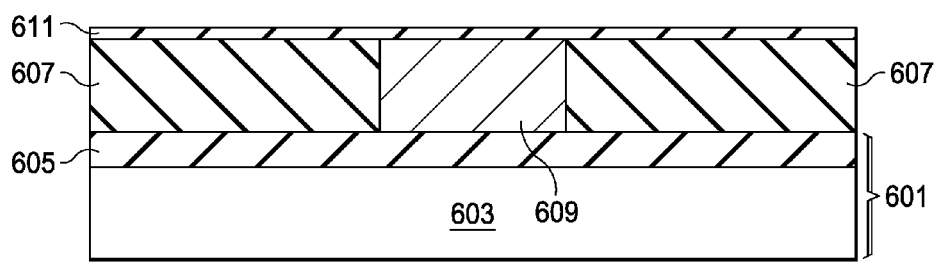
FIG. 6 illustrates a placement of the carbon layer onto a semiconductor substrate in accordance with an embodiment.

FIG. 6 illustrates a second substrate 601 onto which the carbon layer 205 may be transferred (the transfer is not illustrated in FIG. 6 but is illustrated and discussed below with respect to FIG. 7). The second substrate 601 may comprise a semiconductor substrate 603 along with an insulative substrate 605. The semiconductor substrate 603 may be a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. The semiconductor substrate 603 may be doped with a p-type dopant, such as boron, aluminum, gallium, or the like, although the substrate may alternatively be doped with an n-type dopant, as is known in the art.

The insulative substrate 605 may be formed from an insulative material such as oxide. In an embodiment the insulative substrate 605 may be formed by any oxidation process, such as wet or dry thermal oxidation of the semiconductor substrate 603 in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the insulative substrate 605 may be between about 20 nm to about 500 nm in thickness, such as about 100 nm in thickness.

A gate electrode 609 may be formed in a dielectric layer 607 over the second substrate 601. In an embodiment the dielectric layer 607 may be a dielectric material such as silicon oxide, silicon oxynitride, silicon nitride, an oxide, a nitrogen-containing oxide, aluminum oxide, lanthanum oxide, hafnium oxide, zirconium oxide, hafnium oxynitride, or combinations thereof, and may be formed using a process such as CVD, PVD, ALD, or the like. The dielectric layer 607 may be formed to a thickness of about 1 μm, although any other suitable thickness may alternatively be utilized.

Once the dielectric layer 607 has been formed over the second substrate 601, the gate electrode 609 may be embedded within the dielectric layer 607. In an embodiment the gate electrode 609 may be a conductive material such as aluminum, tungsten, polysilicon, other conductive materials, combinations of these, or the like, and the gate electrode 609 may be formed using a damascene process. For example, after the dielectric layer 607 has been formed, the dielectric layer 607 may be patterned using, e.g., a photolithographic masking and etching process, to form an opening where the gate electrode 609 is desired. Once the opening has been formed, the material for the gate electrode 609 (e.g., aluminum) may be deposited into the opening using a process such as CVD, PVD, or the like, and the gate electrode 609 and dielectric layer 607 may be planarized by, e.g., a chemical mechanical polishing process so that the gate electrode 609 remains embedded in the dielectric layer 607.

Once the gate electrode has been formed, a gate dielectric layer 611 may be formed over the gate electrode 609 and the dielectric layer 607. The gate dielectric layer 611 may comprise a dielectric material such as hexagonal boron nitride (h-BN), hafnium oxide ($HfO_2$), aluminum oxide ($Al_2O_3$), or other suitable dielectric material. In an embodiment in which hexagonal boron nitride is utilized, the hexagonal boron nitride may be mechanically transferred and placed over the gate electrode 609 and the dielectric layer 607, while, if hafnium oxide is utilized, a deposition process such as ALD may be utilized to deposit the gate dielectric 611 over the gate electrode 609 and the dielectric layer 607. The gate dielectric layer 611 may have a thickness of about 10 nm.

Figure 7:
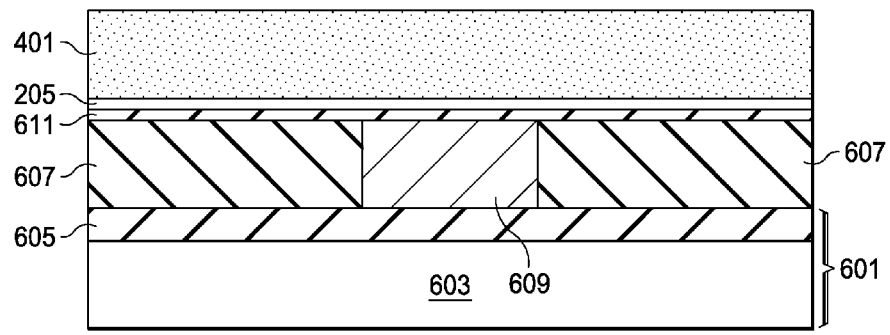
FIG. 7 illustrates a removal of the transfer layer from the carbon layer in accordance with an embodiment.

FIG. 7 illustrates that, once the first substrate 101 and the silicide layer 203 have been removed from the carbon layer 205, the transfer layer 401 may be utilized to place the carbon layer 205 over the second substrate 601 and in contact with the gate dielectric layer 611. The placement of the carbon layer 205 may be performed by controlling the transfer layer 401 (with the carbon layer 205 attached) and using the transfer layer 401 to align the carbon layer 205 with the gate dielectric layer 611.

Figure 8:
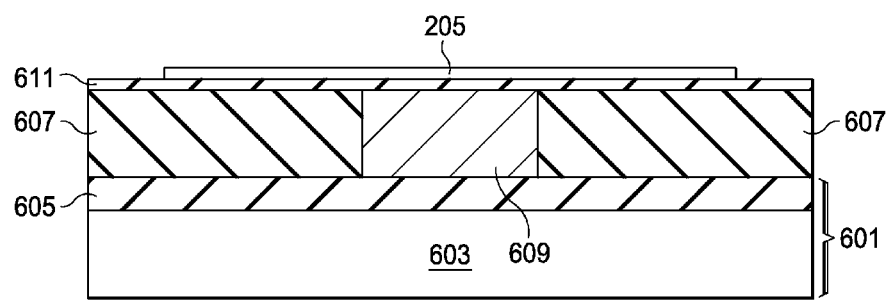
FIG. 8 illustrates a formation of a transistor using a portion of the carbon layer as a channel in accordance with an embodiment.

FIG. 8 illustrates a removal of the transfer layer 401 once the carbon layer 205 has been placed on the gate dielectric layer 611. The transfer layer 401 may be removed using a stripping or etching process to remove the material of the transfer layer 401 from the carbon layer 205. As such, while the materials utilized to remove the transfer layer 401 may be at least in part dependent upon the material chosen for the transfer layer 401, in an embodiment in which the transfer layer 401 is PMMA, the transfer layer 401 may be removed by applying acetone to the PMMA, which dissolves the PMMA.

However, as one of ordinary skill in the art will recognize, the use of PMMA for the transfer layer 401, and the use of the transfer layer 401 in general, is not intended to limit the embodiments. Rather, any suitable method of transferring the carbon layer 205 and integrating the carbon layer 205 into a manufacturing process flow may be utilized. For example, the carbon layer 205 may be transferred while the first substrate 101 and the silicide layer 203 are still attached to the carbon layer 205. Once the carbon layer 205 is in place, the first substrate 101 and the silicide layer 203 may then be removed, thereby avoiding the need for the transfer layer 401. This and any other suitable method for transferring the carbon layer 205 are fully intended to be included within the scope of the embodiments.

FIG. 8 also illustrates a patterning of the carbon layer 205. In an embodiment the patterning is performed to turn the carbon layer 205 into individual channel regions and contact points for various devices such as a transistor 900 (not illustrated in FIG. 8 but illustrated and discussed below with respect to FIG. 9). In an embodiment the patterning may be performed using a photolithographic masking and etching process. For example, a photosensitive material may be applied to the carbon layer 205, exposed to a patterned energy source such as light, and developed to form a mask over the carbon layer 205. The mask may then be used to etch or otherwise remove those portions of the carbon layer 205 that are exposed by the mask in order to pattern the carbon layer 205. Once the carbon layer 205 has been patterned, the mask may be removed, thereby leaving behind the patterned carbon layer 205.

Figure 9:
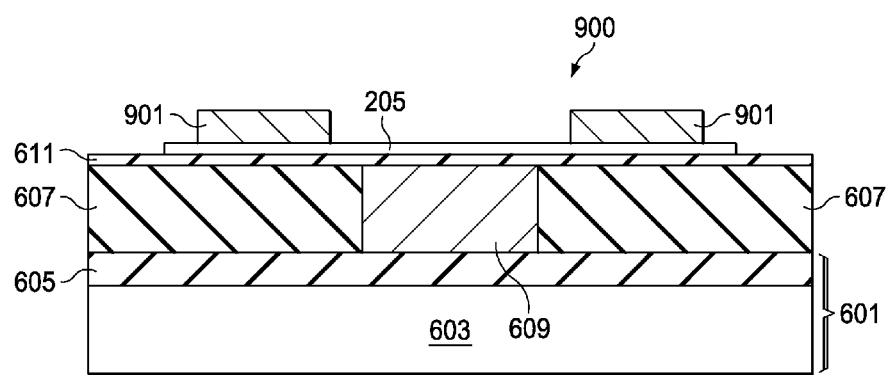
FIG. 9 illustrates a formation of contacts to the carbon layer in the formation of the transistor in accordance with an embodiment.

FIG. 9 illustrates a formation of contacts 901 to the carbon layer 205 to form a transistor 900. The contacts 901 are utilized to adjust the work function of the carbon layer 205 where the carbon layer 205 makes contact with the contacts 901, thereby forming source and drain regions within the carbon layer 205. In an embodiment the contacts 901 may be formed of a conductive material such as nickel, platinum, palladium, combinations of these, or the like, and may be formed by a deposition process such as CVD, PVD, ALD, combinations of these, or the like. The contacts 901 may be formed to a thickness of about 10 nm to 100 nm.

However, as one of ordinary skill in the art will recognize, the above description of a transistor with a carbon layer 205 and an embedded gate electrode 609 is merely one type of transistor that may utilize the carbon layer 205. For example, the gate electrode 609 may not be embedded within the dielectric layer 607 but may, instead, be formed over the carbon layer 205 after the carbon layer 205 has been attached to the second substrate 601 and after the gate dielectric 611 has been formed over the carbon layer 205. Is such an embodiment, the dielectric layer 607 may optionally be avoided, and the carbon layer 205 may be directly attached to the insulative substrate 605.

Additionally, the carbon layer 205 is not limited to being placed on a semiconductor substrate and utilized as a channel region for a transistor. Rather, the carbon layer 205 may be transferred to any suitable substrate and may be utilized in any suitable fashion. For example, the carbon layer 205 may be utilized as part of a stack for displays. This and any other suitable use for the carbon layer 205 and its transfer are fully intended to be included in the scope of the embodiments.

In accordance with an embodiment, a method for manufacturing a channel material comprising depositing a first metal layer on a substrate, the substrate comprising carbon, is provided. A silicide is epitaxially grown on the substrate, the epitaxially growing the silicide also forming a layer of carbon over the silicide.

In accordance with another embodiment, a method of manufacturing a semiconductor device comprising forming a first metal layer over a carbon-containing substrate is provided. The first metal layer and the carbon-containing substrate are annealed to form a first silicide region and a carbon layer over the first silicide region, wherein the annealing the first metal layer and the carbon-containing substrate causes the first silicide region to be epitaxially grown.

In accordance with yet another embodiment, a method of manufacturing a semiconductor device comprising providing a substrate comprising carbon, the substrate having a first lattice constant, is provided. A first metal layer is deposited in contact with the substrate, and a carbon layer is formed over the substrate, the forming the carbon layer comprising growing a monocrystalline silicide on the substrate, the monocrystalline silicide having a second lattice constant the same as the first lattice constant.

Although the present embodiments and their advantages have been described in detail, it should be understood that various changes, substitutions and alterations can be made herein without departing from the spirit and scope of the disclosure as defined by the appended claims. For example, the thickness of the metal layer may be modified to tune the carbon layer, and the precise order of process steps laid out in the above described embodiments may be altered while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a channel material, the method comprising:
    depositing a first metal layer on a substrate, the substrate comprising silicon carbon, wherein the silicon carbon has a (111) crystalline orientation;
    epitaxially growing a silicide on the substrate, the epitaxially growing the silicide also forming a layer of carbon over the silicide, wherein the layer of carbon is a product from a reaction of the first metal layer and the substrate; and
    curing the layer of carbon with a first anneal, wherein the curing the layer of carbon is performed after the epitaxially growing the silicide on the substrate.

2. The method of claim 1, wherein the layer of carbon is graphene.

3. The method of claim 1, wherein the epitaxially growing the silicide further comprises performing a second anneal.

4. The method of claim 3, wherein the performing the second anneal is performed at least in part at a temperature of less than about 800° C.

5. The method of claim 1, further comprising:
    transferring the layer of carbon to a semiconductor substrate; and
    forming a transistor from at least a portion of the layer of carbon.

6. A method of manufacturing a semiconductor device, the method comprising:
    forming a first metal layer over a carbon-containing substrate, wherein the carbon-containing substrate has a (111) crystalline orientation; and
    annealing the first metal layer and the carbon-containing substrate to form a first silicide region and a graphene layer from the first metal layer and the carbon-containing substrate, wherein the graphene layer is located over the first silicide region, wherein the annealing the first metal layer and the carbon-containing substrate is performed at a temperature of less than 200° C. and causes the first silicide region to be epitaxially grown.

7. The method of claim 6, wherein the first metal layer has a thickness of less than about 10 nm.

8. The method of claim 6, wherein the carbon-containing substrate comprises silicon carbon.

9. The method of claim 6, further comprising:
    removing the graphene layer from the first silicide region using a transfer layer; and
    placing the graphene layer onto a semiconductor substrate.

10. A method of manufacturing a semiconductor device, the method comprising:
    providing a substrate comprising carbon, the substrate having a first lattice constant and a (111) crystalline orientation;
    depositing a first metal layer in contact with the substrate; and
    forming a carbon layer over the substrate, wherein the carbon layer is graphene, the forming the carbon layer comprising growing a monocrystalline silicide on the substrate, the monocrystalline silicide having a second lattice constant the same as the first lattice constant, wherein the carbon layer comprises carbon from the substrate; and
    curing the carbon layer after the forming the carbon layer, wherein the forming the carbon layer is performed at least in part using a first anneal and the curing the carbon layer is performed at least in part using a second anneal different from the first anneal, and wherein the second anneal occurs after the growing the monocrystalline silicide.

11. The method of claim 10, wherein the first anneal further comprises annealing the substrate and the first metal layer at a temperature less than about 800° C.

12. The method of claim 10, further comprising:
    separating the carbon layer from the monocrystalline silicide;

transferring the carbon layer to a semiconductor substrate; and forming a channel within the carbon layer.

13. The method of claim 10, wherein the first metal layer has a thickness of less than about 10 nm.

14. The method of claim 1, wherein, prior to the depositing the first metal layer on the substrate, the silicide is chosen such that a lattice constant of the silicide is close to a lattice constant of the substrate.

15. The method of claim 3, wherein the performing the first anneal is performed at least in part at a temperature of less than about 200° C.

16. The method of claim 6, wherein the carbon-containing substrate comprises silicon germanium carbon.

17. The method of claim 11, wherein the forming the carbon layer further comprises annealing the substrate and the first metal layer at a temperature less than about 200° C.

18. The method of claim 1, wherein the silicon carbon has a thickness between about 0.5 μm and about 500 μm.

19. The method of claim 6, further comprising an insulator located beneath the carbon-containing substrate.

20. The method of claim 10, wherein the first metal layer comprises platinum, cobalt, palladium, copper, or iron.

\* \* \* \* \*